US006463516B1

(12) United States Patent
Leong et al.

(10) Patent No.: US 6,463,516 B1
(45) Date of Patent: Oct. 8, 2002

(54) VARIABLE SECTOR SIZE FOR A HIGH DENSITY FLASH MEMORY DEVICE

(75) Inventors: Nancy S. Leong, Sunnyvale, CA (US); Johnny C. Chen, Cupertino, CA (US); Tiao-Hua Kuo, San Jose, CA (US); Kazuhiro Kurihara, Sunnyvale, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 139 days.

(21) Appl. No.: 09/663,765

(22) Filed: Sep. 18, 2000

Related U.S. Application Data
(60) Provisional application No. 60/199,671, filed on Apr. 25, 2000.

(51) Int. Cl.[7] ............................................. G06F 12/02
(52) U.S. Cl. ..................... 711/170; 711/172; 711/103; 365/185.33
(58) Field of Search ................................. 711/103, 170, 711/171, 172, 173; 365/185.33

(56) References Cited

U.S. PATENT DOCUMENTS

| 5,263,000 A | | 11/1993 | Van Buskirk et al. ...... 365/226 |
| 5,270,980 A | * | 12/1993 | Pathak et al. ............... 257/314 |
| 5,291,446 A | | 3/1994 | Van Buskirk et al. .. 365/189.09 |
| 5,663,907 A | * | 9/1997 | Frayer et al. .......... 365/185.18 |
| 5,708,387 A | | 1/1998 | Cleveland et al. .......... 327/536 |
| 6,128,695 A | * | 10/2000 | Estakhri et al. ............. 711/103 |
| 6,170,066 B1 | * | 1/2001 | See ............................ 713/340 |
| 6,172,915 B1 | * | 1/2001 | Tang et al. ............ 365/185.22 |
| 6,272,584 B1 | * | 8/2001 | Stancil ........................ 710/10 |
| 6,324,096 B1 | * | 11/2001 | Tomita ................... 365/185.05 |
| 6,335,883 B1 | * | 1/2002 | Fukuda et al. ......... 365/185.33 |

OTHER PUBLICATIONS

US 5,612,921, 3/1997, Chang et al. (withdrawn)
AMD Datasheet for Am29LV640D/Am29LV641D, (first published May 4, 1999—see revision history on last page).
AMD Press Release #9965—"AMD Announces Industry's First 3.0–Volt, 64–Megabit Nor Flash Memory Device", p. 1 of 1, Apr. 26, 1999, ©1999 Advanced Micro Devices, Inc.

* cited by examiner

*Primary Examiner*—Hiep T. Nguyen

(57) ABSTRACT

A variable sector size for a flash memory device is disclosed. The total available memory of the flash memory device is divided into sub-units. Each sub-unit has a pre-decoder coupled with it to enable operations on the memory within that sub-unit. A sector size control register is coupled with pre-decoder enabling logic which is coupled with the pre-decoders. The sector size control register and pre-decoder enabling logic determines how many pre-decoders, and therefore how many sub-units, are activated at a given time for a given memory operation.

16 Claims, 4 Drawing Sheets

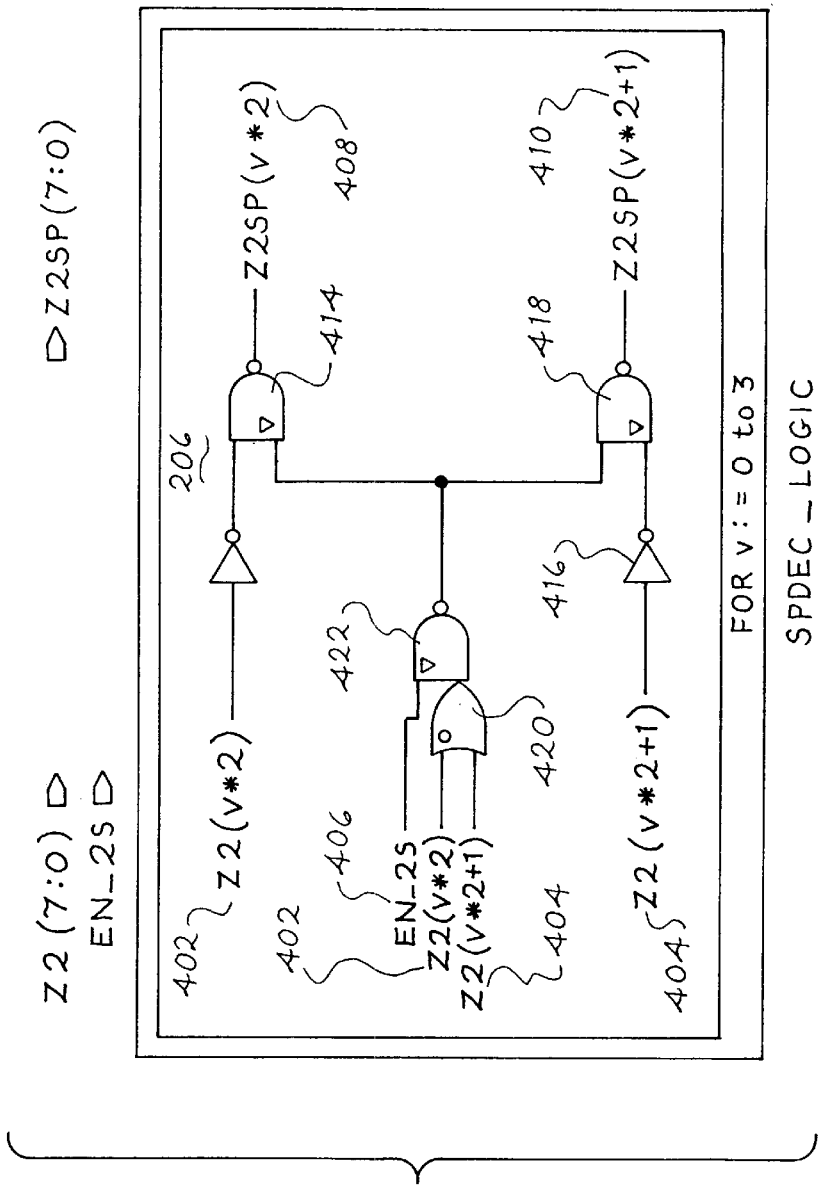

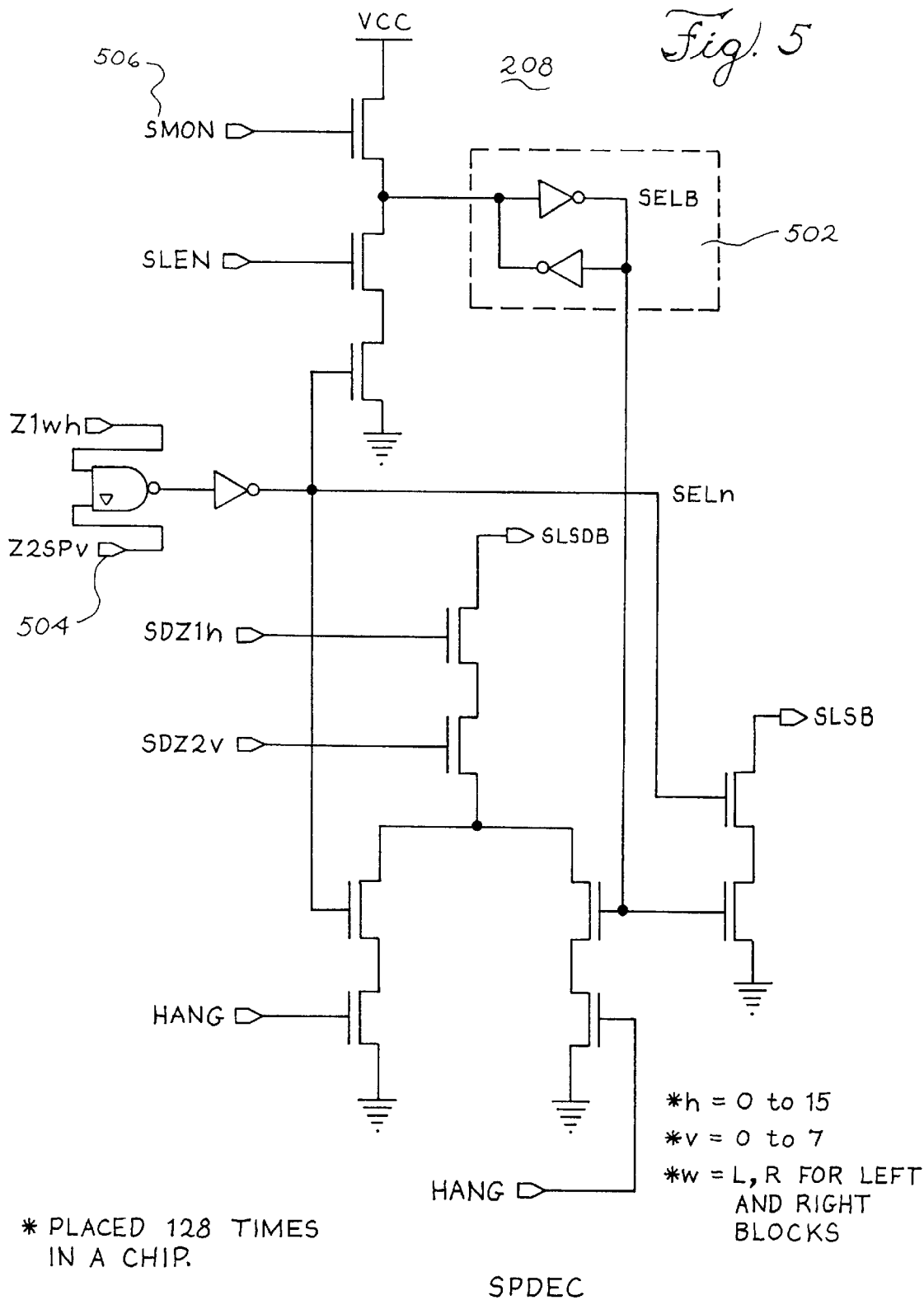

VARIABLE SECTOR SIZE FOR A HIGH DENSITY FLASH MEMORY DEVICE

REFERENCE TO EARLIER FILED APPLICATION

This application claims the benefit of the filing date pursuant to 35 U.S.C. §119(e) of Provisional Application Serial No. 60/199,671, filed Apr. 25, 2000, the disclosure of which is hereby incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips he removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals two or four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

Another problem with existing flash memory devices has been the low density of storage offered as compared with traditional dynamic random access memory ("DRAM"). With the ever increasing need for storage space in modem electronic devices combined with the need to reduce the number of discrete components, there has been a corresponding pressure to increase the amount of storage available on a single flash memory device. This increase in storage density must not come at the expense of reliability.

One way to increase the storage capacity of a flash memory device is to use a core cell with a dual-level floating gate structure. Such a structure allows one core cell to represent more than one bit of information without increasing the size/area of the device. However, such dual-level core cells are difficult to design and implement because they require complex programming, erase and read logic. This is because the multiple voltage levels that can be stored in the cell now represent more than one logical value and the programming, erase and read logic must now be able to discriminate among these voltage levels. This raises concerns with the ability of the flash memory device to reliably store and retrieve data.

SUMMARY

The present invention is defined by the following claims, and nothing in this section should be taken as a limitation on those claims. By way of introduction, the preferred embodiments described below relate to a high density flash memory device with a variable sector size. The device includes an array comprising a plurality of sub-units with each of the sub-units comprising one or more single level flash memory cells. Each of the plurality of sub-units is coupled with a sub-unit pre-decoder which is operative to enable an operation on the one or more single level flash memory cells of the corresponding sub-unit. The device further includes a sector selector coupled with the sub-unit pre-decoders and operative to decode an input memory address and activate one or more of the sub-unit pre-decoders corresponding to the input memory address for the operation. In addition, the device includes a sector size control register coupled with the sector selector and operative to control the number of sub-unit pre-decoders activated for the input memory address and the operation.

The preferred embodiments further relate to a method of varying the sector size of a high density flash memory device comprising an array of single level flash memory cells and a sector size control register. The method comprises: subdividing the array of single level flash memory cells into a plurality of sub-units, each of the sub-units further comprising a sub-unit pre-decoder; storing data in the sector size control register where the stored data represents the number of sub-units to be enabled for a memory address of the array; decoding an input memory address; and enabling one or more of the sub-unit pre-decoders based on the decoded input memory address and the stored data.

BRIEF DESCRIPTION OF THE DRAWINGS

FIG. 3 depicts a schematic diagram of a preferred 128K sector activation logic for use with the embodiment o FIG. 2.

FIG. 4 depicts a schematic diagram of a preferred sector pre-decoder selector for use with the embodiment of FIG. 2.

FIG. 5 depicts a schematic diagram of a preferred sector pre-decoder for use with the embodiment of FIG. 2.

DETAILED DESCRIPTION OF THE PRESENTLY PREFERRED EMBODIMENTS

Herein, the phrase "coupled with" is defined to mean directly connected to or indirectly connected with through one or more intermediate components. Further, as used herein. the phrase "high logic level" is used to indicate a logic level of 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low") and some signals are asserted when they are at a high logic level (also referred to as "active high"). It will be appreciated that all forms of digital logic representation are contemplated including mixed logic. It will further be appreciated that the underlying voltages of the logic signals may also vary, with typical values being 2 or 3 Volts representing a logic 1 and 0 Volts representing logic 0.

Figure 1:
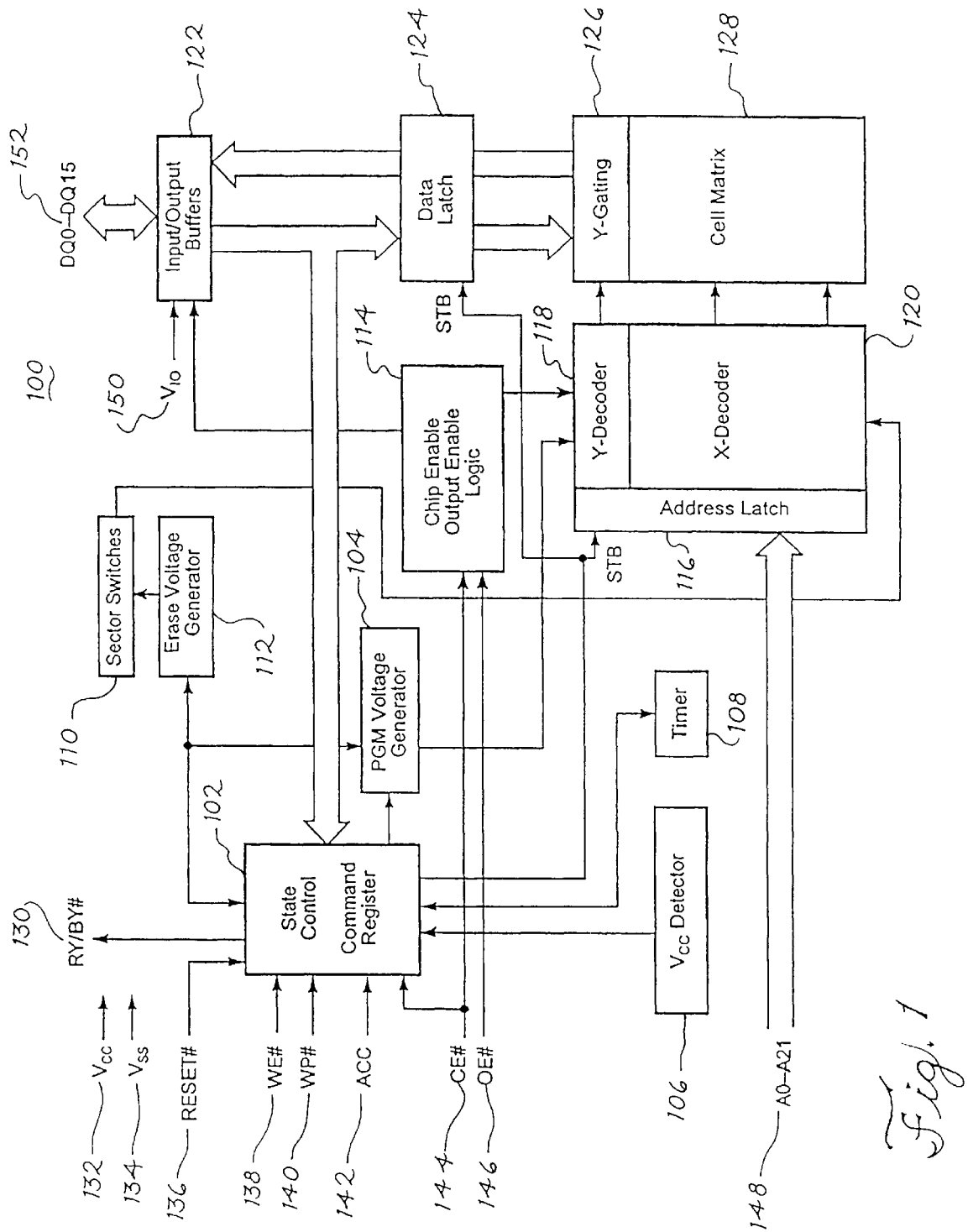
FIG. 1 depicts a block diagram of a 64 Mb flash memory chip according to the present invention.

Referring now to the Figures and in particular, FIG. 1, there is schematically shown a flash memory device 100 according to the present invention that provides 64 megabits (Mb) of storage using a single level NOR type flash memory cell. An exemplary flash memory device 100 is the Am29LV640DU and Am29LV641DU 64 Mb flash memory chips manufactured by Advanced Micro Devices, Inc., located in Sunnyvale, Calif. These devices are discussed in more detail in "Advance Information: Am29LV640DU/Am29LV641DU 64 Megabit (4 M×16-Bit) CMOS 3.0 Volt-only Uniform Sector Flash Memory with Versatile I/O™ Control," published by Advanced Micro Devices, Inc., located in Sunnyvale, Calif., herein incorporated by reference.

The exemplary flash memory device 100 utilizes a single level NOR flash memory cell which is fabricated using a 0.25$\mu$m technology. This allows higher densities and smaller die sizes. In addition single level NOR flash memory cells require less complex programming, erase and read logic versus dual level memory cells. Further, it is easier to ensure uniform cell performance across a large array of single level NOR cells. For example, each cell only needs to be characterized by one threshold voltage.

The device 100 includes a state control and command register 102, a program voltage generator 104, a Vcc detector 106, a timer 108, sector switches 110, an erase voltage generator 112, chip and output enable logic 114, an address latch 116, a Y-decoder 118, an X-decoder 120, input/output buffers 122, a data latch 124, Y-gating 126 and the cell matrix/array 128. The device 100 further includes inputs and outputs for ready/busy 130, labeled "RY/BY#", operating power 132, abeled "Vcc", ground 134, labeled"Vss", reset 136, labeled "RESET#", write enable 138, labeled "WE#", write protect 140, labeled "WP#", accelerate 142, labeled "ACC", chip enable 144, labeled "CE#", output enable 146, labeled "OE#", a 22 bit address input bus 148, labeled "A0-A21", output buffer power 150, labeled "Vio", and a 16 bit data input/output bus 152, labeled "DQ0-DQ15". The# following a signal name indicates that this signal is asserted when it has a low logic value (active low). In one embodiment, all of the components of FIG. 1 are contained on a single integrated circuit chip. The operation and use of these input and output signals is further explained in the above mentioned reference.

Note that the exemplary flash memory device 100, having 64 megabits (or 8 megabytes) is word addressable and therefore accommodates a 22 bit address input 148 and a 16 bit data input/output 152. It will be appreciated that the data size granularity with which the device 100 can be accessed can vary with the implementation and amount of total storage, with a smaller granularity requiring more input address bits and fewer data input/output bits and vice versa, and all such implementations are contemplated. For example, a device 100, having 64 megabits of storage. which is byte addressable requires 23 address bit inputs 148 and 8 data input/outputs 152. In another alternative, the device 100 supports both word and byte addressing on the same integrated circuit.

The state control and command register 102 includes the state machine and control logic which controls the operation of the device 100. This includes controlling the embedded programming and erase operations as well as other general operations of he device 100, which are discussed in more detail below. The state control and command register is responsive to the reset input 136, the write enable input 138, the write protect input 140, the accelerate input 142 and the chip enable input 144. The reset input is used to perform a hardware reset of the device 100. The write enable input 138 is used to signal the device 100 that data is to be stored in the array 128. The write protect input 140 is used to control the write protect functions of the device 100 which prevent accidental erasure of the contents stored in the array 128. The accelerate input 142 is used to speed up programming and erase functions. The chip enable input 144 is used to enable access to the device 100. The state control and command register further includes a ready/busy output 130 which indicates when the device is busy undergoing an embedded operation.

The PGM voltage generator 104 generates the necessary voltages for programming the flash memory cells of the cell matrix/array 128. The erase voltage generator 112 generates the necessary voltages for erasing the flash memory cells of the array 128. The voltage generators 104 and 112 contain voltage pumps (not shown) and switching multiplexors (not shown) which generate and route the necessary high voltages for erasing and programming flash memory cells as well as generating the necessary voltages for read operations under the direction of the state control and command register 102. These voltage pumps include a VPXGG pump, a voltage booster circuit, a VPPIG pump, a drain pump and a negative pump.

The VPXGG pump is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference.

During read o erations, the voltage booster is used to boost the word line voltage while the drain pump is used to boost the bit line voltage prior to sensing the output voltage levels. A more detailed description of one exemplary implementation of a voltage booster circuit can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

The VPPIG pump is a high voltage pump used to pass high voltage to the drain of the memory cells. Various drain power supplies, known in the art, can be used for the present in vention. One exemplary drain pump is disclosed in U.S. Pat. No. 5,263,000, "DRAIN POWER SUPPLY", to Van Buskirk, et al., the entire contents of which are incorporated herein by reference.

The negative pump is used to generate a relatively high negative voltage to the control gates of selected memory cells via the word lines. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

Referring back to FIG. 1, the flash memory device 100 further includes a Vcc detector 106 which detects when normal operating power is applied to the device 100. The Vcc detector 106 signals the state control and command register 102 when proper Vcc is detected. The timer 108 is used by the state control and command register 102 to properly control and synchronize the embedded program and erase operations. The sector switches 110 are used to route the voltages used during the erase operation to the proper sectors which are undergoing erase. The Chip and output enable logic 114 is responsive to the chip enable 144 and output enable 146 inputs. This logic is used to enable the device 100 to receive and pass data via the input/output buffers 122. The address latch 116 receives the address for a read or write operation from the address inputs 148. The address latch 116 latches the address for subsequent decoding. The Y-decoder 118 decodes the column address in the memory array 128 from the address latched in the address latch 116 . The X-decoder 120 decodes the row address in the memory array 128 from the address latchled in the address latch 116. The input/output buffers 122 buffer read data that is being output and write data that is being input to/from the external data bus 152 of the device 100. The input/output buffers receive power from an external voltage source, Vio 150 . The data latch 124 latches and holds data being written to the array 128 coming from the input/output buffers 122 or data being read from the array 128 going to the buffers 122. The data latch 124 holds the data steady so it can be written or output depending on the operation underway. The Y-gating 126 gates the data being read from or written to the array 128. The cell matrix/array 128 includes an array of flash memory cells arranged in a row and column addressable format. Alternatively, the cell matrix/array 128 may include one or more banks to subdivide the accessible memory along with the additional hardware necessary to support multiple banks. The individual memory cells in the array 128 are further sub-grouped into sectors such that one or more sectors may be erased at any given time. In the exemplary flash memory device 100, the array 128 is arranged as 128 64 kilobyte sectors. It will be appreciated that there are many ways to implement the basic structure of the flash memory device 100 including alternate input/output interfaces, alternate memory array structures along with accompanying supporting logic and all such alternatives are contemplated.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state control and command register 102, which uses a command register to manage the commencement of either sequence. The erase and programming operations are only accessed via the command register which controls an internal state machine that manages device Operations. Commands are written to the command register via the data inputs 152 to the memory device 100.

In the memory device 100, each memory cell, within the cell array 128, includes a single level nor-type floating gate transistor (not shown). It will be appreciated by those skilled in the art, however, that there are many ways to implement a single level flash memory cell and that the configurations and operating characteristics may vary. It will further be appreciated that the embodiments disclosed herein are generally applicable and not limited to one particular implementation of a single level flash memory cell.

The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump. An exemplary high positive voltage applied to the source during an erase is approximately 5 volts and an exemplary high negative voltage applied to the control gate/word line by the negative pump is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply and the control gate/word line is connected to a high voltage provided by the VPXGG pump positive power supply. An exemplary high voltage applied to the drain by the VPPIG is approximately 5 Volts while an exemplary high voltage applied to the control gate by the VPXGG pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell requires higher than normal voltages, reading from the cell only requires the availability of the normal supply voltage. To read from the memory cell, the source is connected to ground (also referred to as Vss) and the control gate/word line are connected to the booster power supply. Prior to selecting the transistors for a read, the bit lines are charged up via the drain pump. When the cells turn on (if erased), they will connect their respective bit line to ground, grounding out the bit line. The current value of the memory cell is then sensed from the drain/bit line connection. The booster power supply is used to boost the word lines during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state command and control register 102. This logic 102 controls the multiplexors that place the proper voltages from the various power supplies and Vcc on the memory cell inputs depending on the desired function.

A number of different vendors produce flash memory devices, many of these devices having various differing capabilities and tradeoffs. Often, one or more vendors may offer a capability in their devices which becomes adopted by a significant portion of the flash memory customer base. This customer base will then demand that capability (i.e. compatibility) from any devices that they are going to buy from other vendors. For example, a particular chip interface offered by one vendor may provide for easier routing of printed circuit board signal paths and therefore be preferred by a manufacturing company over other vendors flash memory devices. Electronic devices incorporating flash memory devices are complicated and difficult to design. Therefore, once this interface is incorporated into a current design, most likely, future generations of that design will also incorporate it. If a competitive vendor wishes to sell their devices to this company, they must offer a compatible interface because the company is unlikely to go back and change their design, incurring significant re-design and verification costs, just to use a competitive product. However, the vendor, typically, must still support the remaining customer base which has not adopted the capability.

Effectively, this means that a vendor must design and maintain an inventory of flash memory devices which are compatible with the different devices of other vendors so that they can compete with these other vendors for customers who demand those capabilities. Another example of a compatibility issue has to do with sector size. In the exemplary flash memory device 100, each sector is 64 kilobytes in size. As was noted above, erase operations are performed sector by sector. If a user wishes to erase a portion of the flash memory device 100, they must supply the erase command along with an address of the sector which encompasses the portion they want to erase. Often, the portion to be erased is larger than one sector. In this case, the exemplary flash memory device 100 allows the user to specify the addresses for each sector to be erased, one after the other. Once these addresses are specified, the device 100 performs an embedded operation to erase each specified sector. Therefore, to erase two successive 64 kilobyte sectors, the user must give the erase command followed by the address of the first sector and then the address of the second sector. The device 100 will then erase the two sectors.

Other vendors of flash memory devices utilize a sector with a larger size. For example, the devices of some vendors utilize a sector which stores 128 kilobytes. This larger sector size has the advantage that to erase the equivalent amount of memory, the 128 kilobyte sector requires only one address be given to the device while in al device 100 with a 64 kilobyte sector size, two addresses must be given. Products designed to utilize a 128 kilobyte sector cannot work with devices 100 which provide a 64 kilobyte sector because the product is not designed to give two addresses to erase 128 kilobytes of the flash memory.

Therefore, in order to maintain sector size compatibility, the exemplary flash memory device 100 offers a variable sector size which can be set so that the device has either a 64 kilobyte sector size or a 128 kilobyte sector size. It is preferable that only two sector sizes be offered to reduce logical complexity, a minimum sector size and a maximum sector size equal to twice the minimum sector size. However, it will be appreciated that the disclosed embodiments are scaleable and can be used to offer sector sizes larger than 128 kilobytes such as 192, 256 or 512 kilobytes. Further, where the minimum individual sector size is reduced, a more granular range of sector sizes can be offered. For example, where the minimum sector size is 32 kilobytes, sector sizes of 32, 64, 96, 128 kilobytes, etc. can be offered.

Figure 2:
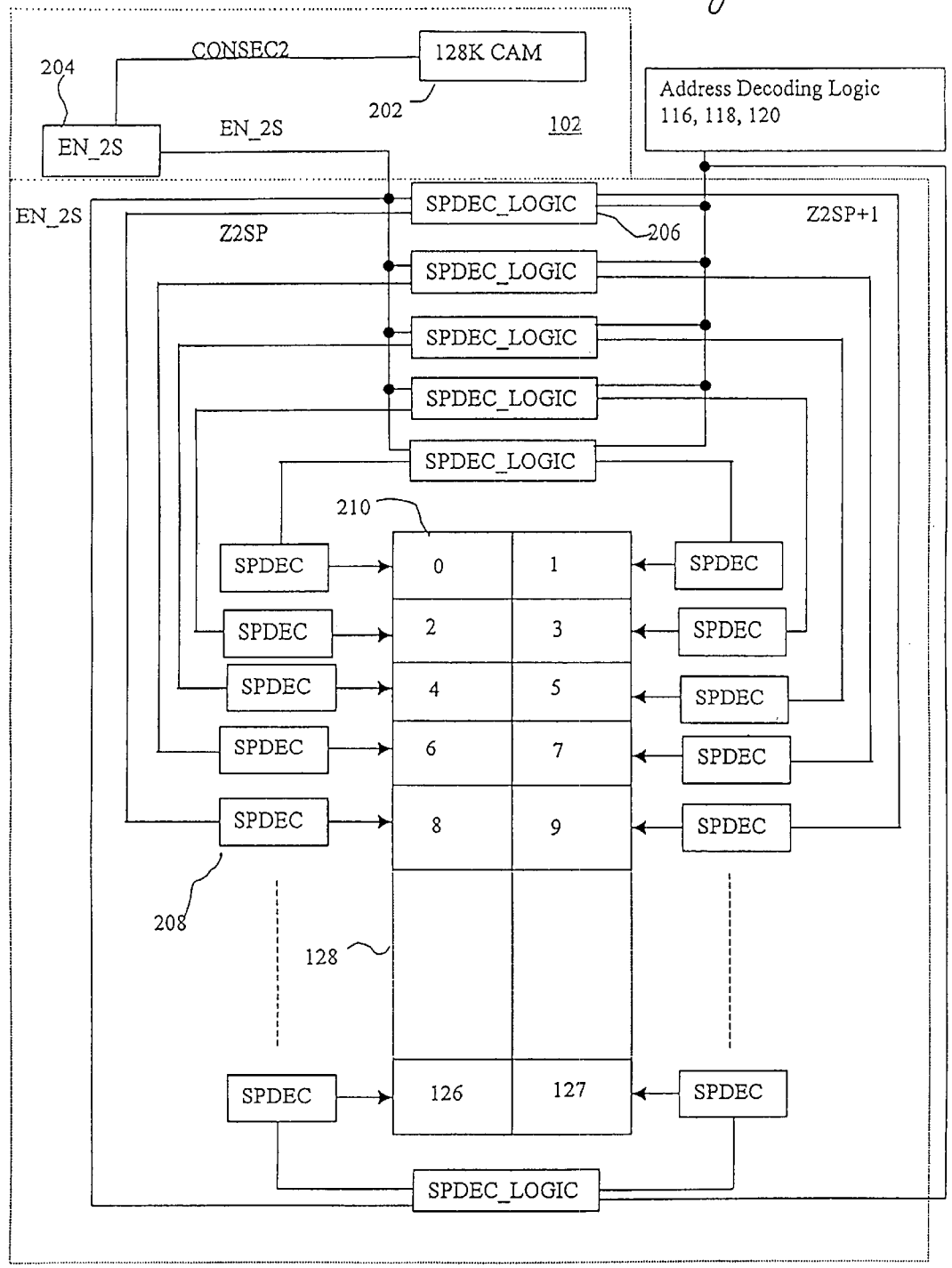
FIG. 2 depicts a block diagram of a first embodiment of a flash memory device having a variable sector size.

Referring to FIG. 2, there is shown a block diagram of the logic of the state command and control register 102 and address decoding logic 116, 118, 120 which implements the variable sector size in the exemplary device 100. For the sake of clarity, a number of the components of the state command and control register 102 and the address decoding logic 116, 118, 120 have been deleted in FIG. 2. This logic includes a 128K Content Addressable Memory 202 ("128K CAM"), 128K sector activation logic 204, labeled "EN_2S", sector pre-decoder selectors 206, labeled "SPDEC_LOGIC", and sector pre-decoders 208, labeled "SPDEC". As was described above, the memory array 128 is divided into sub-units 210 called sectors. The exemplary memory array 128 comprises 128 sectors 210, each storing 64 kilobytes of data. Alternatively, the sector 210 size can be larger or smaller. Each sector 210 has a corresponding sector pre-decoder 208 and there is one sector pre-decoder selector 206 for each pair of sector pre-decoders 208 corresponding to two consecutive sectors 210.

The 128K CAM 202 is a control register which stores a data value representing the desired sector size for the device 100. This CAM 202 is actually a flash memory cell which can be programmed or erased depending on the desired sector size. If the CAM 202 is programmed, i.e. has a logical value of "0", the sector size will be 128 kilobytes. If the CAM 202 is erased, i.e. has a logical value of "1", the sector size will be 64 kilobytes. In one alternative embodiment, the values the 128K CAM 202 represent other sector sizes. Alternatively, the 128K CAM 202 can store more than one bit of data to represent a range of potential sector sizes for the device 100.

The output of the 128K CAM 202, labeled "CONSEC2", is coupled with 128K sector activation logic 204. Referring to FIG. 3, this logic 204 interprets the value stored in the CAM 202 and enables the sector pre-decoder selectors 206 to select one or two sector pre-decoders 208 depending on the desired sector 210 size. The 128K sector activation logic 204 is coupled with each sector predecoder selector 206 by the output signal labeled "EN_2S". The 128K sector activation logic 204 includes a NAND gate 302 and an inverter 304. The CONSEC2 signal is coupled with the NAND gate 302. In alternative embodiments, other control signals which enable a 128 kilobyte sector size are also coupled with the NAND gate 302. The output of the NAND gate 302 is coupled with the inverter 304. The output of the inverter 304 is the EN_2S signal. When the CONSEC2 signal is a logical 1, the NAND gate 302 and inverter 304 will assert the EN_2S signal as a logical 1 as well.

Referring back to FIG. 2, each sector pre-decoder selector 206 is coupled with the address decoding logic (shown in FIG. 1, reference numerals 116, 118, 120). For a given address decoded by the address decoding logic, the sector pre-decoder selector 206 corresponding to the appropriate sector 210 is activated. Depending on the value of the 128K CAM 202, the activated sector pre-decoder selector 206 will, in turn, activate one or two sector pre-decoders 208 for the sectors 210 to be erased. Each sector pre-decoder selector 206 is coupled to two sector pre-decoders by signal paths labeled "Z2SP" and "Z2SP+1".

In actual operation, a user who wishes to erase one or more sectors 210 first sends an erase command to the device 100. Following the erase command, the user can then transmit an address corresponding to the first sector 210 to be erased. After transmitting the first address, the user can then send another address for a second sector 210 to be erased, etc. After a pre-determined time elapses without the user having sent an address, the device 100 begins the process of erasing the particular sectors 210 indicated by the user. More detail on the operation of the erase function of the exemplary flash memory device 100 can be found in "Advance Information: Am29LV640DU/Am29LV641DU 64 Megabit (4 M×16-Bit) CMOS 3.0 Volt-only Uniform Sector Flash Memory with Versatile I/O™ Control," published by Advanced Micro Devices, Inc., located in Sunnyvale, Calif., herein incorporated by reference.

Internally, the state control and command register 102 recognizes the erase command sent by the user. Each address sent subsequent to the erase command is decoded by address decoding logic 116, 118, 120 into the appropriate sector predecoder 208 for the sector 210 to be erased. Each sector pre-decoder 208 is coupled to the address decoding logic 116, 118, 120 through a sector pre-decoder selector 206. As will be discussed below and shown in FIG. 5, each sector predecoder 208 includes a latch 502 which, when set, indicates that the corresponding sector is to be erased. The decoding of the address sent by the user sets the latch 502 in the sector pre-decoder 208. Once the last address has been sent by the user and the state command and control register 102 begins the erase process, each sector 210 whose corresponding sector pre-decoder 208 has its latch 502 set will be erased.

Referring now to FIG. 4, there is shown a preferred sector pre-decoder selector 206 for use with the present embodiments. The selector 206 includes inputs 402, 404 for the sector pre-decoder 208 activation signal from the address decoding logic 116, 118, 120, labeled "Z2(v*2)" and "(Z2(v*2+1)", an input 406 for the EN_2S signal from the 128K sector activation logic 204 and outputs 408, 410 for the selected sector pre-decoder activation signals, labeled "Z2SP(v*2)"and "Z2SP(v*2+1)". Each sector pre-decoder selector 206 is used to enable the sector pre-decoders 208 of two consecutive sectors 210.

The Z2(v*2) input 402 is coupled to the input of an inverter 412 whose output is coupled to one input of a NAND gate 414. The output of the NAND gate 414 is the Z2SP(v*2) output 408. The Z2(v*2+1) input 404 is coupled to the input of an inverter 416 whose output is coupled to one input of a NAND gate 418. The output of the NAND gate 418 is the Z2SP(v*2+1) output 410. In addition, the Z2(v*2) and Z2(v*2+1) inputs 402, 404 are also coupled to the inputs of a NOR gate 420. The output of the NOR gate 420 is connected to the input of a NAND gate 422. The other input of the NAND gate 422 is connected with the EN_2S input 406. The output of the NAND gate 422 is coupled to a second input of NAND gate 414 and a second input of NAND gate 418.

In this configuration, when the EN_2S input 406 is unasserted, assertion of one of the sector pre-decoder 208 activation signal inputs 402, 404 will result in the assertion of only the corresponding selected sector pre-decoder activation signal output 408. 410. If the EN_2S input 406 is asserted., assertion of either of the sector pre-decoder 208 activation signal inputs 402, 404 will result in the assertion of both of the corresponding selected sector pre-decoder 208 activation signal outputs 408, 410.

Referring now to FIG. 5, there is shown a preferred sector pre-decoder 208 for use with the present embodiments. The sector pre-decoder 208 includes an input 504 for the selected sector pre-decoder 208 activation signal output 408 from the sector pre-decoder selector 206. The sector pre-decoder 208 also includes a latch 502. The input 504 is coupled with the latch 502 through the intermediary logic 506. When the input 504 is asserted, the latch 502 can be set to indicate that the corresponding sector 210 should be erased.

In this way, a variable sector size is implemented in the exemplary flash memory device 100. The variable sector size allows the selection of either a 64 kilobyte or 128 kilobyte sector size. The implementation is based on dividing the memory array into sub-units, each sub-unit representing the minimum sector size available. The control logic and sector size control registers then control how many sub-units are activated or operated upon for a given operation. By activating more than one sub-unit, a larger sector size is achieved. The disclosed implementation utilizes simple logic to achieve a flexible and scaleable sector size. It will be appreciated that the size of the sectors and the number of available sizes offered by the device 100 may vary and that all such combinations are contemplated.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It will be appreciated that there are many ways to implement the disclosed logic. It is therefore intended that the foregoing detailed description be regarded as illustrative rather than limiting, and that it be understood that it is the following claims, including all equivalents, that are intended to define the spirit and scope of this invention.

We claim:

1. A high density flash memory device comprising:
   an array comprising a plurality of sub-units, each of said plurality of sub-units comprising one or more single level flash memory cells, each of said plurality of sub-units being coupled with a sub-unit pre-decoder, said sub-unit pre-decoder being operative to enable an operation on said one or more single level flash memory cells of said corresponding sub-unit;
   a sector selector coupled with said sub-unit pre-decoders and operative to decode an input memory address and activate one or more of said sub-unit pre-decoders corresponding to said input memory address for said operation; and
   a sector size control register coupled with said sector selector and operative to control the number of sub-unit pre-decoders activated for said input memory address and said operation.

2. The high density flash memory device of claim 1, wherein the number of sub-unit pre-decoders activated for a given input address is a function of data stored in said sector size control register.

3. The high density flash memory device of claim 2, wherein said data is characterized by first and second values and further wherein:
   said sector decoder activates two of said sub-unit pre-decoders corresponding to said input memory address when said data is equal to said first value; and
   said sector decoder activates one of said sub-unit pre-decoders corresponding to said input memory address when said data is equal to said second value.

4. The high density flash memory device of claim 1, wherein each of said plurality of sub-units comprises 512 Kilobits of single level flash memory cells.

5. The high density flash memory device of claim 1, wherein said operation is an erase operation.

6. The high density flash memory device of claim 1, wherein said operation is a program operation.

7. A method of Varying the sector size of a high density flash memory device comprising an array of single level flash memory cells and a sector size control register, said method comprising:
   (a) subdividing said array of single level flash memory cells into a plurality of sub-units, each of said sub-units further comprising a sub-unit pre-decoder;
   (b) storing data in said sector size control register, said stored data representing the number of sub-units to be enabled for a memory address of said array;
   (c) decoding an input memory address; and
   (d) enabling one or more of said sub-unit pre-decoders based on said decoded input memory address and said stored data.

8. The method of claim 7, wherein each of said plurality of sub-units comprises 512 Kilobits of single level flash memory cells.

9. The method of claim 7, wherein said data is characterized by first and second values and further wherein (d) further comprises enabling two sub-unit pre-decoders when said data equals said first value and enabling one sub-unit pre-decoder when said data equals said second value.

10. The method of claim 7, further comprising:
    (e) performing a memory operation on said enabled one or more sub-units.

11. The method of claim 10, wherein said operation further comprises erasing said enabled one or more sub-units.

12. The method of claim 10, wherein said operation further comprises programming said enabled one or more sub-units.

13. A sector decoder for a flash memory array, said flash memory array being sub-divided into a plurality of sub-units, said sector decoder comprising:
   a sector size register operative to store data representing the number of said plurality of sub-units to be enabled for a memory operation;

an address decoder operative to decode an input memory address;

selection logic coupled with said address decoder, said sector size register and said flash memory array and operative to enable one or more of said plurality of sub-units corresponding to said decoded input memory address and said stored data for said operation.

14. The sector decoder of claim 13, wherein said data is characterized by first and second values and further wherein said selection logic is further operative to enable two of said one or more sub-units when said data is equal to said first value and enable one of said one or more sub-units when said data is equal to said second value.

15. The sector decoder of claim 13, wherein said operation is an erase operation.

16. The sector decoder of claim 13, wherein said operation is a program operation.

* * * * *